(12) United States Patent
Sogard

(10) Patent No.: US 7,236,232 B2
(45) Date of Patent: Jun. 26, 2007

(54) USING ISOTOPICALLY SPECIFIED FLUIDS AS OPTICAL ELEMENTS

(75) Inventor: Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/594,934

(22) Filed: Nov. 9, 2006

(65) Prior Publication Data

US 2007/0053090 A1 Mar. 8, 2007

Related U.S. Application Data

(60) Division of application No. 11/311,247, filed on Dec. 20, 2005, which is a continuation of application No. PCT/US04/21159, filed on Jun. 30, 2004.

(60) Provisional application No. 60/484,276, filed on Jul. 1, 2003.

(51) Int. Cl.
*G02B 21/33* (2006.01)
*G03F 7/20* (2006.01)

(52) U.S. Cl. .................. 355/53; 355/30; 252/582

(58) Field of Classification Search ............. 359/862, 359/832, 665–667, 820, 228; 355/53, 30; 252/582; 356/135
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 5,610,683 A | 3/1997 | Takahashi | |
| 5,715,039 A | 2/1998 | Fukuda et al. | |
| 5,825,043 A | 10/1998 | Suwa | |
| 6,097,532 A | 8/2000 | Harris et al. | |
| 6,381,013 B1 | 4/2002 | Richardson | |
| 6,665,126 B2 | 12/2003 | Shafer et al. | |
| 6,888,127 B2 | 5/2005 | Jones et al. | |
| 2002/0163629 A1 | 11/2002 | Switkes et al. | |
| 2003/0030916 A1 | 2/2003 | Suenaga | |

(Continued)

FOREIGN PATENT DOCUMENTS

DE 221 563 A1 4/1985

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner*—Leonidas Boutsikaris
*Assistant Examiner*—Mark Consilvio
(74) *Attorney, Agent, or Firm*—Oliff & Berridge, PLC

(57) ABSTRACT

Fluidic optical elements and systems use isotopically specified fluids for processing light passing therethrough. The isotopic composition of the fluid may be adjusted to vary the optical properties. The properties of the isotopically specified fluid may be monitored and adjusted to obtain the desired optical characteristics of the fluidic optical element. In one embodiment, a method of optically processing light includes directing light through an optical element that includes an isotopically specified fluid disposed in a confined space. The isotopically specified fluid is selected to provide a preset desired effect on the light directed therethrough for optically processing the light.

14 Claims, 2 Drawing Sheets

U.S. PATENT DOCUMENTS

| | | |
|---|---|---|
| 2003/0174408 A1 | 9/2003 | Rostalski et al. |
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rotalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnychenko et al. |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0264778 A1 | 12/2005 | Lof et al. |
| 2005/0270505 A1 | 12/2005 | Smith |
| 2006/0066962 A1 | 3/2006 | Totzeck et al. |

FOREIGN PATENT DOCUMENTS

| | | |
|---|---|---|
| DE | 224 448 A1 | 7/1985 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-124873 | 5/1994 |
| JP | A-7-220990 | 8/1995 |
| JP | A-8-316125 | 11/1996 |
| JP | A-10-303114 | 11/1998 |
| JP | A 10-340846 | 12/1998 |
| JP | A-11-176727 | 7/1999 |
| JP | A-2000-58436 | 2/2000 |
| WO | WO 99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |

| | | |
|---|---|---|
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, 3rd 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, :Potential performance and feasibility of immersion lithography, Soichi Owa et al., 33 pages, slides 1-33.

Fernandez-Prini et al., "Release on the Refractive Index of Ordinary Water Substance as a Function of Wavelength, Temperature and Pressure," International Association for the Properties of Water and Steam, pp. 1-7 {Sep. 1997}.

Shafer et al., "Isotope Effect in the Photodissociation of HDO at 157.5 nm," J. Chem. Phys., vol. 90, No. 11, pp. 6807-6808 {Jun. 1, 1989).

Heller, et al., "Isotope Effects on the Electronic Properties of $H_2O$ and $D_2O$ in the Vacuum Uv[a])," The Journal of Chemical Physics, vol. 67, No. 5, pp. 1858-1860 {Sep. 1, 1977}.

Luten, Jr., The Refractive Index of $H^2H^2O$; The Refractive Index and Density of Solutions of $H^2H^2O$ in $H^1H^1O$, Physical Review, vol. 45, pp. 161-165 {Feb. 1, 1934}.

Bertie et al., "The Refractive Index of Colorless Liquids in the Visible and Infrared: Contributions from the Absorption of Infrared and Ultraviolet Radiation and the Electronic Molar Polarizability Below 20 500 $cm^{-1}$," J. Chem. Phys., vol. 103, No. 23, pp. 10152-10161 {Dec. 15, 1995}.

US 7,236,232 B2

USING ISOTOPICALLY SPECIFIED FLUIDS AS OPTICAL ELEMENTS

CROSS-REFERENCE TO RELATED APPLICATIONS

This is a divisional of U.S. patent application Ser. No. 11/311,247 filed Dec. 20, 2005, which in turn is a continuation of International Application No. PCT/US2004/021159 filed Jun. 30, 2004, which claims the benefit of U.S. Provisional Patent Application No. 60/484,276 filed Jul. 1, 2003. The disclosures of these applications are incorporated herein by reference in their entireties.

BACKGROUND

The invention relates generally to optical systems and elements and, more particularly, to the use of isotopically specified fluids as optical elements including applications in immersion lithography.

An exposure apparatus is one type of precision assembly that is commonly used to transfer images from a reticle onto a semiconductor wafer during semiconductor processing. A typical exposure apparatus includes an illumination source, a reticle stage assembly that retains a reticle, an optical assembly (sometimes referred to as a projection lens), a wafer stage assembly that retains a semiconductor wafer, a measurement system, and a control system. The resist coated wafer is placed in the path of the radiation emanating from a patterned mask and exposed by the radiation. When the resist is developed, the mask pattern is transferred onto the wafer. In microscopy, extreme ultraviolet (EUV) radiation is transmitted through a thin specimen to a resist covered plate. When the resist is developed, a topographic shape relating to the specimen structure is left.

Immersion lithography is a technique that can enhance the resolution of projection lithography by permitting exposures with numerical aperture (NA) greater than one, which is the theoretical maximum for conventional "dry" systems. By filling the space between the final optical element and the resist-coated target (i.e., wafer) with an immersion fluid, immersion lithography permits exposure with light that would otherwise be totally internally reflected at an optic-air interface. Numerical apertures as high as the index of the immersion liquid (or of the resist or lens material, whichever is least) are possible. Liquid immersion also increases the wafer depth of focus, i.e., the tolerable error in the vertical position of the wafer, by the index of the immersion liquid compared to a dry system with the same numerical aperture. Immersion lithography thus has the potential to provide resolution enhancement equivalent to the shift from 248 to 193 nm. Unlike a shift in the exposure wavelength, however, the adoption of immersion would not require the development of new light sources, optical materials, or coatings, and should allow the use of the same or similar resists as conventional lithography at the same wavelength. In an immersion system where only the final optical element of the optical assembly and its housing and the wafer (and perhaps the stage as well) are in contact with the immersion fluid, much of the technology and design developed for conventional tools in areas such as contamination control, carry over directly to immersion lithography.

The immersion fluid in an immersion lithography system serves as a fluidic optical element. Fluids can also be used to form optical elements such as those inside the optical assembly of an exposure apparatus. The use of a fluid as an optical element raises certain issues and challenges but also provides new opportunities.

SUMMARY

Embodiments of the invention are directed to fluidic optical elements and systems using isotopically specified fluids for processing light passing therethrough. The isotopic composition of the fluid may be adjusted to vary the optical properties. The properties of the isotopically specified fluid may be monitored and adjusted to obtain desired optical characteristics of the fluidic optical element. Examples of such properties include the isotopic composition, index of refraction, temperature, and pressure. Water has optical properties that are suitable as the immersion fluid in an immersion lithography system. Water further has mechanical properties such as low viscosity and surface tension characteristics that render it particularly desirable for use in immersion lithography. The index of refraction of an immersion fluid plays a role in the imaging during lithography. Generally, an immersion fluid having a higher index of refraction is more desirable. The heavier isotopes of water can provide a desired higher index of refraction.

In accordance with an aspect of the invention, a method of optically processing light comprises directing light through an optical element that includes an isotopically specified fluid disposed in a confined space. The isotopically specified fluid is selected to provide a preset desired effect on the light directed therethrough for optically processing the light.

In some embodiments, the isotopically specified fluid comprises one or more isotopes of a fluid. The isotopically specified fluid may comprise a plurality of isotopes of a fluid, and an isotopic composition of the fluid is monitored. The method further comprises adjusting amounts of the plurality of isotopes of the fluid to change the isotopic composition based on the monitored isotopic composition of the fluid. The method may also comprise adjusting amounts of the plurality of isotopes of the fluid to form a variable isotopic composition of the fluid to provide variable optical characteristics of the optical element.

In specific embodiments, the isotopically specified fluid comprises one or more isotopes of water. The method further comprises positioning the optical element in an immersion lithography apparatus at a location between an optical assembly and a substrate to be processed by lithography, wherein the light is directed through the optical assembly and the optical element to the substrate. The isotopically specified fluid of the optical element has a first index of refraction and the confined space is provided in a container comprising a material having a second index of refraction that is different from the first index of refraction. The method further comprises recirculating the isotopically specified fluid between the confined space of the optical element and a recirculation reservoir. The method may also comprise controlling at least one of a temperature, a pressure, and an isotopic composition of the isotopically specified fluid in the optical element. The confined space is provided in a container which comprises fused silica. The light has a wavelength of about 193 nm or greater.

In accordance with another aspect of the invention, an optical element comprises a container and an isotopically specified fluid disposed in the container. The isotopically specified fluid is selected to provide a preset desired effect on a light directed therethrough for optically processing the light.

In accordance with another aspect of the present invention, an optical system for processing a substrate comprises an optical assembly spaced from a substrate by a space and an optical element disposed in the space between the optical assembly and the substrate. The optical element includes an isotopically specified fluid selected to provide a preset desired effect on a light directed therethrough for optically processing the light.

BRIEF DESCRIPTION OF THE DRAWINGS

The invention will be described in conjunction with the accompanying drawings of exemplary embodiments in which like reference numerals designate like elements and in which.

DETAILED DESCRIPTION OF EMBODIMENTS

Figure 1:
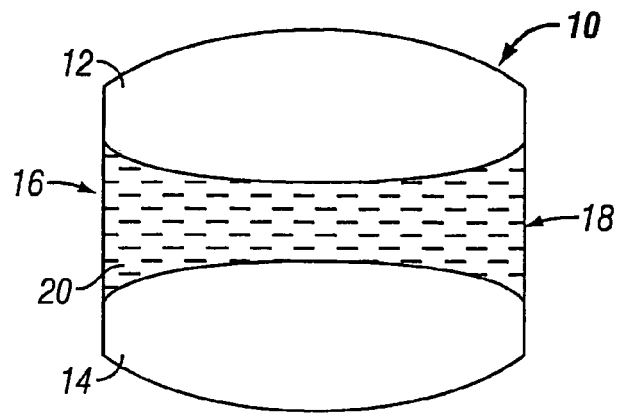
FIG. 1 is a simplified schematic view of an optical assembly including an optical element having an isotopically specified fluid according to an embodiment of the invention.

FIG. 1 shows an optical assembly 10 including two solid optical elements 12, 14, and a fluidic optical element 16 disposed therebetween. In the specific embodiment shown, the solid optical elements 12, 14 are converging lenses and the fluidic optical element 16 is a diverging lens. The solid optical elements 12, 14 may be made of glass or the like. The fluidic optical element 16 includes an isotopically specified fluid 20 disposed in a confined space defined by the surfaces of the two solid optical elements 12, 14 and a side wall 18. The side wall 18 is sealed to the solid optical elements 12, 14. The side wall 18 may be made of a transparent material such as glass.

As used herein, the term "isotopically specified fluid" refers to a fluid of defined chemical composition, where the molecules making up the fluid are distinguished by the specific isotopes of their elemental constituents, the corresponding molecular weight, and their concentration in the fluid. For example, for the case of water, the basic molecular constituent is $H_2O$ and the fluid would be characterized by information similar to the following:

TABLE 1

| Molecular constituents | Molecular weight | Concentration | Comments |
| --- | --- | --- | --- |
| $H_2O^{16}$ | 18 | 0.99985 | H = most abundant isotope of hydrogen; $O^{16}$ = most abundant isotope of oxygen |

TABLE 1-continued

| Molecular constituents | Molecular weight | Concentration | Comments |
| --- | --- | --- | --- |
| $HDO^{16}$ | 19 | $<10^{-5}$ | D = deuterium, heavy isotope of hydrogen |
| $D_2O^{16}$ | 20 | 0.00015 | |
| $H_2O^{17}$ | 19 | $<10^{-5}$ | |
| $HDO^{17}$ | 20 | $<10^{-5}$ | |
| $D_2O^{17}$ | 21 | $<10^{-5}$ | |
| $H_2O^{18}$ | 20 | $<10^{-5}$ | |
| $HDO^{18}$ | 21 | $<10^{-5}$ | |
| $D_2O^{18}$ | 22 | $<10^{-5}$ | |

Only stable isotopes are listed in Table 1. Radioactive isotopes, for the case of water, are short lived enough that they are not likely to be present in a high enough concentration to be significant. In other fluids however, radioactive isotopes may have to be considered as well. Table 1 is representative of "normal water" which contains approximately 0.015% heavy water. The concentrations labeled "$<10^{-5}$" represent levels below which no significant change in refractive index occurs. In the case of water, a change of approximately $10^{-5}$ may change the refractive index by about 1 ppm which is assumed to be insignificant for the present application. For other fluids and applications the level of significant concentration would have to be determined.

Figure 2:
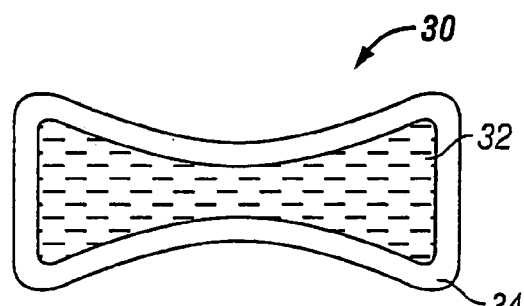
FIG. 2 is an elevational view of an optical element having an isotopically specified fluid according to another embodiment of the invention.

FIG. 2 shows another fluidic optical element 30 including an isotopically specified fluid 32 disposed in a container 34. The container 34 may be made of glass, fused silica, or the like. In some cases, the isotopically specified fluid 32 has a first index of refraction and the material of the container 34 has a second index of refraction that is different from the first index of refraction. The isotopically specified fluid 32 may include a plurality of isotopes of a fluid. Different isotopes have different optical properties such as the index of refraction. The amounts of the plurality of isotopes of the fluid may be adjustable to form a variable isotopic composition of the fluid to provide variable optical characteristics of the optical element. In addition to the isotopically specified fluid, the shape of the container 34, the optical properties of the container material, and the configuration of the cavity for the isotopically specified fluid 32 in the container 34 can be selected to produce the desired characteristics of the fluidic optical element 30.

The fluidic optical element 30 has two materials, namely, the material of the isotopically specified fluid 32 and the material of the container 34. This makes it possible to correct for chromatic aberrations or spectral dispersions. Some prior optical elements rely on the introduction of calcium fluoride into fused silica or a similar glass material to form a solid optical element. While calcium fluoride provides suitable optical properties, it is difficult and expensive to produce due to its crystalline nature and it introduces certain undesirable material properties such as intrinsic birefringence, as well as additional birefringence arising from mechanical stress in the optical element. The isotopically specified fluid 32 in the fluidic optical element 30 may replace the use of calcium fluoride in some prior optical elements.

Figure 3:
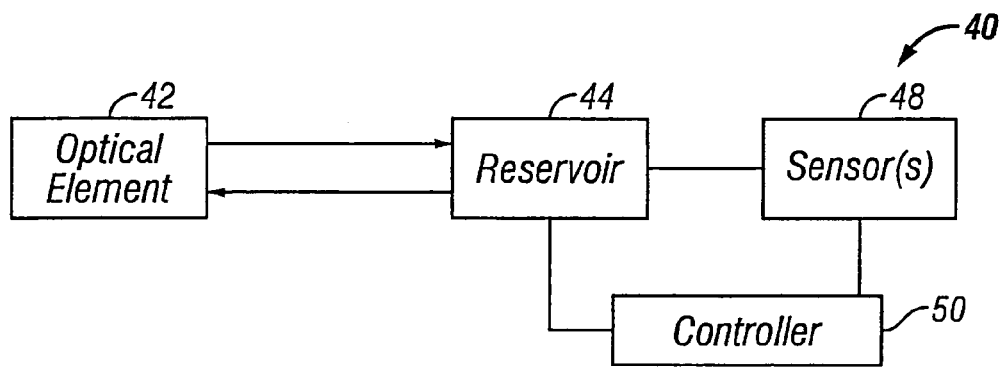
FIG. 3 is a simplified schematic view of a fluidic system for an optical element illustrating a recirculation arrangement according to another embodiment of the invention.

FIG. 3 shows a system 40 for providing a fluidic optical element 42 to process light passing therethrough. In this closed system, the isotopically specified fluid is recirculated between the optical element 42 and a reservoir 44. One or more sensors 48 are used to monitor the properties of the isotopically specified fluid, such as the isotopic composition, index of refraction, temperature, pressure, and the like. In FIG. 3, the sensors 48 are coupled to the reservoir 44, but may be coupled to the optical element 42 or another part of the recirculation system to monitor the fluid. The sensor information is provided from the sensors 48 to a controller 50, which adjusts the properties of the isotopically specified fluid based on the sensor information, such as controlling any of the temperature, pressure, index of refraction, and isotopic composition of the fluid.

Figure 4:
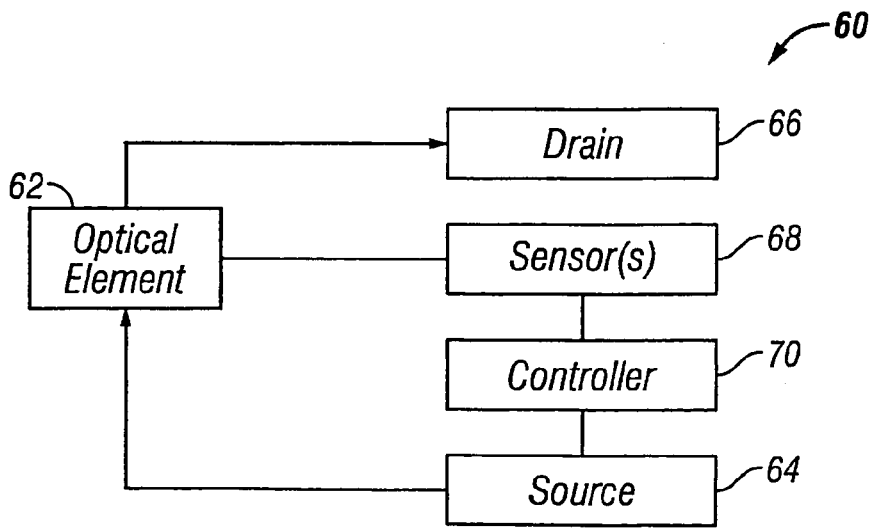
FIG. 4 is a simplified schematic view of a fluidic system for an optical element illustrating an open system arrangement according to another embodiment of the invention.

FIG. 4 shows an open system 60 for providing a fluidic optical element 62 to process light passing therethrough. The isotopically specified fluid is supplied to the optical element 62 from a source 64 and exits the optical element 62 to a drain 66. One or more sensors 68 are coupled to the optical element 62 or another part of the flow path upstream or downstream of the optical element 62, and are used to monitor the properties of the isotopically specified fluid. The sensor information is provided from the sensors 68 to a controller 70 which adjusts the properties of the isotopically specified fluid based on the sensor information.

The closed and open flow systems of FIGS. 3 and 4 maintain a constant flow of the isotopically specified fluid through the fluidic optical elements. The flow can ensure uniformity of the isotopically specified fluid and properties of the optical elements, and can eliminate the formation of voids or the like. It can also facilitate monitoring and control of the isotopically specified fluid for the optical elements.

Figure 5:
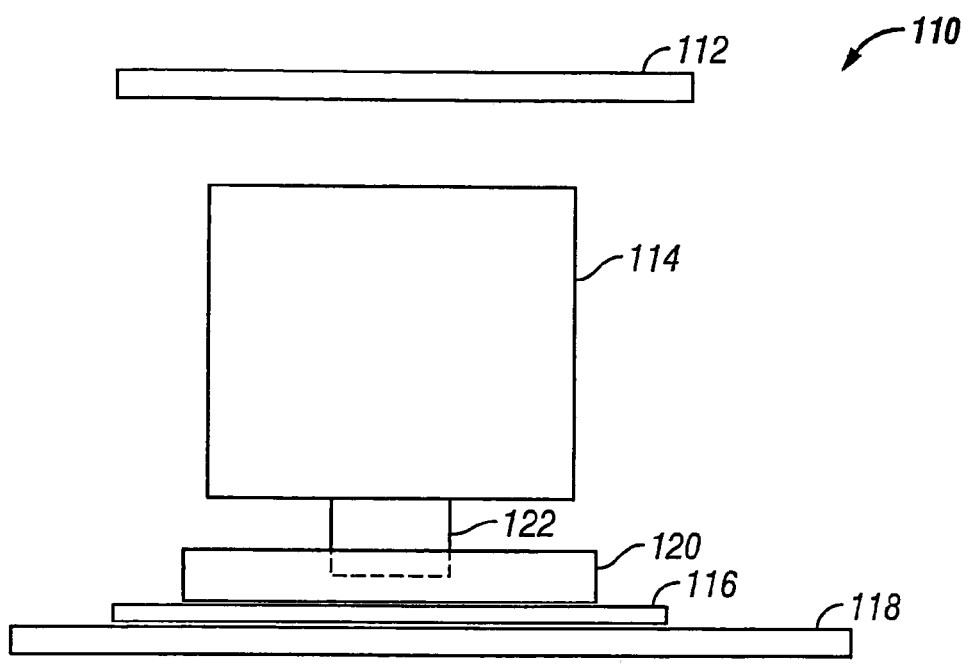
FIG. 5 is a simplified schematic view of an immersion lithography system employing an isotopically specified fluid according to another embodiment of the invention.

FIG. 5 shows an immersion lithography system 110 including a reticle stage 112, a projection lens or optical assembly 114, and a wafer or substrate 116 supported on a wafer stage 118. An immersion apparatus 120 is disposed between the final optical element 122 of the projection lens 114 and the wafer 116 to provide an immersion fluid therebetween. In the present embodiment, the immersion fluid is an isotopically specified fluid, and forms a fluidic optical element in the path of the light between the projection lens 114 and the wafer 116. The isotopically specified fluid is typically provided as a continuous flow through the space between the projection lens 114 and the wafer 116 to form the fluidic optical element.

The system for providing the isotopically specified fluid to the immersion lithography system 110 is preferably a closed immersion fluid control system, where the fluid is recovered and recycled after exposure of a wafer. This is highly desirable because it is important to maintain the isotopic composition and thus the fluid's optical properties, and because at least some of the isotopes are likely to be rare and expensive. Even the vapor from the fluid should be recovered. A system with many of the desired characteristics is described in PCT Application No. PCT/US04/10055, entitled Environmental System Including Vacuum Scavenge For An Immersion Lithography Apparatus, filed Mar. 29, 2004. Additional components may be used to ensure the purity and/or optical properties of the fluid. Some change in isotopic composition may occur from small differences in chemical reactivities or physical properties among the isotopes. Also some impurities may be introduced into the fluid. The chemical and isotopic composition can be monitored, for example, using either optical or mass spectroscopy. Alternatively, the optical properties such as the refractive index can be monitored using a refractometer, and appropriate isotopic molecular constituents added to maintain the property at a constant value. Since impurities may affect the refractive index, this method may maintain a constant index even though the basic chemical composition of the fluid is changing.

The isotopically specified fluid is selected to provide a preset desired effect on a light directed therethrough for optically processing the light, for example, to perform a lithography procedure. The isotopically specified fluid may include a plurality of isotopes of a fluid. The fluid should not react with surrounding components such as the container of the fluidic optical element, the neighboring optical components, and substrates with which the fluid has contact. Water is particularly suitable for certain applications in lithography. Water is generally stable and nonreactive with other optical components and substrates. If water forms part of the optics in a system such as a lithography system, the optical properties of water will need to be known to almost ppm accuracy. The optical properties of water are being measured.

Water may play an important role in immersion lithography. Water has very low optical absorption at wavelengths as short as 193 nm which is the wavelength of an ArF beam. Water has a relatively low viscosity. Thus wafer stage motion and vibrations may not couple through the water to the projection lens to an unacceptable extent. It is important to monitor the isotopic purity or composition of water, because the different isotopes can have significantly different optical properties. First, different sources of water may have slightly different isotopic compositions, leading to possibly significant differences in optical properties. Second, the index of refraction of water can be varied significantly by varying the isotopic composition, which may allow some amount of tuning of the projection optics design. Third, water tuned to an appropriate index of refraction may be introduced elsewhere in the projection optics, to tune the optics further. Because the optical dispersion of water differs from that of fused silica, some amount of chromatic correction is possible.

The refractive indices of the water isotopes are not well determined at the short wavelengths used in optical lithography. The refractive indices for the various isotopes of water are estimated here from the Lorentz-Lorenz model of molecular polarizability:

$$(n^2-1)/(n^2+2)=A\rho,$$

where n is the index of refraction, $\rho$ is the density, and A is an empirical constant. If one assumes that A is the empirical constant for ordinary water, the isotope effect arises basically from changes in the density. Ordinary water is presumed to be $H_2^{16}O$. Normal "heavy" water $D_2O$ is taken to be $D_2^{16}O$, where D is deuterium ($^2H$), the heavy isotope of hydrogen. Of course, there are other isotopes including HDO and heavier isotopes of oxygen, $^{17}O$ and $^{18}O$, that will add to the density effect. At a temperature of 30° C. for a wavelength of 193 nm, the constant A for ordinary water is about 0.262936. Table 2 shows the calculated results of the index of refraction for different isotopes of water. The index of refraction of an immersion fluid plays a role in the imaging during lithography. Generally, an immersion fluid having a higher index of refraction is more desirable. The heavier isotopes of water may provide the desired higher index of refraction.

The above model cannot represent a complete description of the optical properties of the water isotopes, because it neglects differences in the molecular energy levels among the isotopes. Therefore Table 2 represents an approximation. Better measurements of the refractive index of the water isotopes are desirable to confirm or adjust these numbers. The differences in the indices of refraction among the isotopes also cause some difference in the optical absorption of the different isotopes.

TABLE 2

| Isotope | Density ρ (gram/cc) | Index of Refraction |
| --- | --- | --- |
| $H_2O$ | 0.995678 | 1.43664 |
| $D_2O$ | 1.10315 | 1.49188 |
| $D_2{}^{17}O$ | 1.158308 | 1.52112 |
| $D_2{}^{18}O$ | 1.213465 | 1.55103 |

Figure 6:
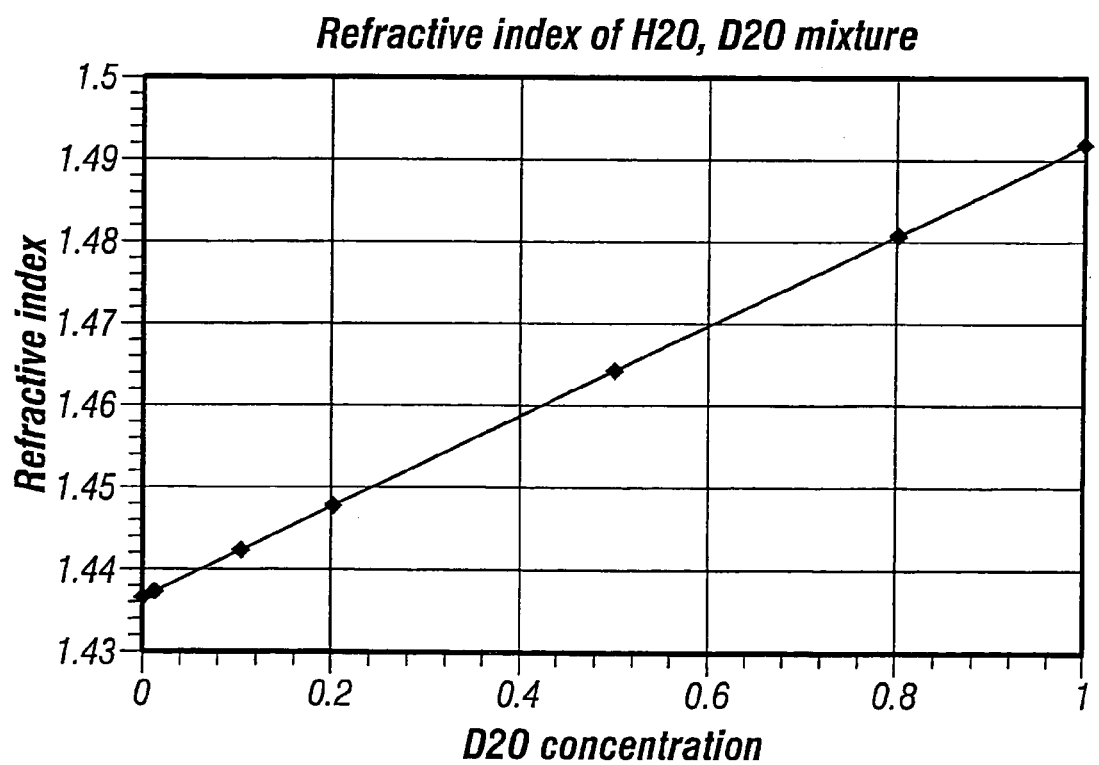
FIG. 6 is a plot of refractive index versus $D_2O$ concentration in water based on calculations.

The natural abundance of heavy water is about 0.015%. This causes a change of about 8 ppm in the refractive index from that of pure $H_2O$, possibly a significant difference. FIG. 6 shows a plot of the variation in refractive index with different concentrations of heavy water based on calculations. Pure $D_2O$ has a refractive index of about 1.492, which is close to the refractive index of calcium fluoride ($Ca_2F$) of about 1.50 at the wavelength of 193 nm. Therefore, heavy water may be able to replace some $Ca_2F$ for chromatic corrections in an optical system containing optical elements formed of fused silica or the like. Table 3 further lists the index of refraction and dispersion at 193 nm for fused silica, calcium fluoride, and different isotopes of water based on calculations. The dispersion of the water isotopes has not been measured at 193 nm. At longer wavelengths, the dispersion of $D_2O$ is lower than that of $H_2O$.

TABLE 3

| Material | Index of Refraction (n) | Dispersion (dn/dλ) |
| --- | --- | --- |
| Fused Silica | 1.5607 | −0.00158 |
| $Ca_2F$ | 1.502 | −0.00099 |
| $H_2O$ | 1.4355 | −0.00199 |
| $D_2O$ | 1.49188 | not measured at 193 nm |
| $D_2{}^{17}O$ | 1.52112 | not measured at 193 nm |
| $D_2{}^{18}O$ | 1.55103 | not measured at 193 nm |

It is to be understood that the above description is intended to be illustrative and not restrictive. Many embodiments will be apparent to those of skill in the art upon reviewing the above description. There are many alternative ways of implementing the methods and apparatus of the invention.

What is claimed is:

1. Microlithographic projection exposure apparatus comprising:
   a projection lens whose last optical surface on the image side is immersed in an immersion liquid, wherein the immersion liquid is enriched with heavy isotopes.

2. Projection exposure apparatus according to claim 1, wherein the proportion of at least one heavy isotope is at least doubled in comparison with the natural isotope distribution.

3. Projection exposure apparatus according to claim 1, wherein the immersion liquid is enriched with deuterium.

4. Projection exposure apparatus according to claim 3, wherein more than 1% of the molecules contained in the immersion liquid contain deuterium.

5. Projection exposure apparatus according to claim 4, wherein more than 80% of the molecules contained in the immersion liquid contain deuterium.

6. Projection exposure apparatus according to claim 5, wherein more than 99% of the molecules contained in the immersion liquid contain deuterium.

7. Projection exposure apparatus according to claim 6, wherein more than 99 molar % of the immersion liquid consists of heavy water.

8. Projection exposure apparatus according to claim 2, wherein the immersion liquid is enriched with deuterium.

9. Projection exposure apparatus according to claim 8, wherein more than 1% of the molecules contained in the immersion liquid contain deuterium.

10. Projection exposure apparatus according to claim 9, wherein more than 80% of the molecules contained in the immersion liquid contain deuterium.

11. Projection exposure apparatus according to claim 10, wherein more than 99% of the molecules contained in the immersion liquid contain deuterium.

12. Projection exposure apparatus according to claim 11, wherein more than 99% molar % of the immersion liquid consists of heavy water.

13. Method for the microlithographic production of a microstructured component, comprising:
   a) providing a projection lens;
   b) arranging a reticle, which contains structures to be projected, in an object plane of the projection lens;
   c) introducing an immersion liquid into an intermediate space which remains between a last optical element on the image side of the projection lens and a photosensitive layer, the immersion liquid being enriched with heavy isotopes;
   d) projecting the structures onto the photosensitive layer.

14. Microstructured component, which is produced by the method according to claim 13.

* * * * *